(12) United States Patent
Gavrilovic

(10) Patent No.: US 6,340,914 B1
(45) Date of Patent: Jan. 22, 2002

(54) PILOT-ASSISTED AMPLIFIER LINEARIZATION CIRCUIT

(75) Inventor: Milan Gavrilovic, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/543,851

(22) Filed: Apr. 5, 2000

(51) Int. Cl.[7] .............................. H03F 3/66; H03F 1/26
(52) U.S. Cl. ......................................... 330/52; 330/151
(58) Field of Search ........................... 330/52, 149, 151

(56) References Cited

U.S. PATENT DOCUMENTS

| | | | |
|---|---|---|---|
| 5,130,663 A | | 7/1992 | Tattersall, Jr. ................. 330/52 |
| 5,691,668 A | * | 11/1997 | Yoshikawa et al. ....... 330/52 X |

* cited by examiner

*Primary Examiner*—Steven J. Mottola

(57) ABSTRACT

A circuit for processing an information signal in which is embedded pilot signal. The circuit is connectable to a configuration used for applying distortion correction to the output of an amplifier fed by the information signal. The information signal can be a CDMA signal or an FDMA signal in which one or more channels are pilot channels containing the pilot signal. The circuit includes first and second demodulators which are used for demodulating the embedded pilot signal at first and second points which are respectively located before and after the application of distortion correction by the configuration. Also described is a controller connected to the first and second demodulators, which varies the amount of distortion correction applied by the configuration as a function of the pilot signals demodulated by the first and second demodulators. By comparing and attempting to match the pilot component present after distortion cancellation to the pilot component present before distortion cancellation, there is improved linearity, partly due to the fact that the pilot component occupies the same frequency region as the information component. The incidence of extraneous signals appearing in frequency regions outside or inside the band of interest is reduced.

42 Claims, 5 Drawing Sheets

PILOT-ASSISTED AMPLIFIER LINEARIZATION CIRCUIT

FIELD OF THE INVENTION

The present invention relates generally to power amplifiers and, more particularly, to circuits used for improving the linearity of such amplifiers.

BACKGROUND OF THE INVENTION

A power amplifier is one of the most important components of a wireless communication system, as it typically makes up the final processing stage before a generated radio-frequency (RF) signal is transmitted over an air interface by an antenna at a base station or a mobile terminal. From this stems the first requirement of a power amplifier, which is to be capable of providing power gain.

Furthermore, the power amplifier must provide sufficient gain over the frequency band of interest. This requirement can be especially demanding in the case of wide band wireless systems such as spread spectrum and in particular CDMA (code division multiple access), where the frequency band of interest is on the order of several Megahertz or more.

In addition, the power amplifier is required to provide as "linear" a response as possible. That is, the signal at the amplifier output should ideally be a scaled and delayed replica of the input to the amplifier, regardless of the amplitude or instantaneous frequency of the input signal. The consequences of a non-linear response include the introduction of "in-band" distortion which may affect the error rate performance of the data signals being transmitted in the frequency band of interest, as well as the introduction of "out-of-band" distortion which may affect the error rate performance of the communications systems used by other licensees in neighbouring frequency bands.

Therefore, it is crucial for power amplifiers to amplify the input signal in a highly linear fashion. However, most amplifiers which are sufficiently powerful and are capable of operating in a desired frequency range often suffer from a non-linear response characteristic. That is, the gain of the amplifier is not constant at all input levels. Furthermore, the group delay also tends to vary across the frequency range of operation.

Thus, in order to improve the linearity of power amplifiers, those skilled in the art have turned to the development of various "linearization" techniques, including feedforward, feedback and pre-distortion amplifier design. Owing to its simplicity and high level of performance, the feedforward linearization technique has found widespread application in wireless communications systems.

In a feedforward amplifier configuration, the output of a "main" amplifier (i.e., the amplifier requiring linearization) is corrected by adding an inverted error signal to the output signal. This error signal is generated by subtracting an attenuated version of the amplifier output from a delayed version of the amplifier input (shifted by 180 degrees in phase with respect to the output signal), and amplifying the result by means of an "error" amplifier. Thus, the error signal is in fact an estimate of the negative of the distortion produced by the main amplifier. Hence, when the error signal is added to the output of the main amplifier, the distortion is cancelled, resulting in improved amplifier linearity.

However, when very strict linearity requirements are imposed over a wide band of frequencies, the just described feedforward linearization technique might still not provide adequate distortion cancellation. This is also true in environments where the various components of the amplifier configuration are subjected to variations due to temperature or aging.

To this end, it has been proposed to use an adaptive technique in order to improve the linearity of a feedforward amplifier configuration and to provide a more predictable level of performance over a wide range of environmental operating conditions. In many cases, it has been found that use of a "pilot signal" for fine tuning the cancellation process can lead to improved performance.

In particular, an externally generated pilot signal is injected at the input of the main amplifier and the presence of the pilot signal is monitored after cancellation with the error signal. If performance of the feedforward configuration is ideal, the pilot signal should disappear after the error signal has been added to the output of the main amplifier. However, if part of the pilot signal remains, this means that the cancellation provided by the error signal is not ideal. Thus, a feedback loop is provided in order to adjust the magnitude and phase of the error signal so as to minimize the power of the distortion of the main amplifier which also minimizes the pilot signal after addition of the error signal.

Unfortunately, the just described pilot-assisted technique has several significant disadvantages which can in fact lead to degraded performance. Firstly, one may consider the problem of where to place the pilot signal in terms of frequency. If the pilot signal is placed inside the band of interest, then the pilot signal will interfere with the RF signal being transmitted across the air interface. The converse is also true, whereby any RF signal content at the pilot signal frequencies can affect the pilot receiver sensitivity and its architectural complexity, hence adversely affecting the performance of the feedback loop responsible for adjusting the error signal.

On the other hand, if the pilot signal is located outside the frequency band containing the desired RF signal requiring amplification, behaviour of the entire amplifier configuration will be biased because linearity at the pilot frequencies does not necessarily lead to linear behaviour in the band of interest. Furthermore, if the feedback loop does not sufficiently remove the out-of-band pilot signal to meet regulatory guidelines, a further filtering stage must be provided, which is not only expensive but can introduce additional performance degradation of the power amplifier (e.g., lowering the output power) and thus may offset any improvement afforded by the feedback loop itself.

Moreover, placing the pilot at the edge of the transmitted signal bandwidth requires an algorithm that is capable of moving and repositioning the pilot in case the transmitted signal is re-set to a new frequency channel. This introduces an additional level of complexity, which is highly undesirable.

It is therefore apparent that there is a need for improving the linearity of an amplifier configuration without resorting to the injection of a pilot signal that must subsequently be removed.

SUMMARY OF THE INVENTION

The present invention provides simplified and improved linearization of an amplifier without the disadvantages associated with the prior art. The invention relies on the use of an embedded pilot signal; that is, the signal being amplified contains both an information component and a pilot component that shares the same frequency region as the information component.

Accordingly, the invention can be summarized broadly as a circuit for processing an information signal in which is embedded a pilot signal, where the circuit is connectable to a configuration used for applying distortion correction to the output of an amplifier fed by the information signal. The information containing the pilot signal can be a spread spectrum signal such as a CDMA signal or a frequency-division multiplexed signal, for example.

The circuit of the invention basically includes first and second demodulators which are used for demodulating the embedded pilot signal at first and second points which are respectively located before and after the application of distortion correction by the configuration. The invention also includes a controller which is connected to the first and second demodulators. The controller varies the amount of distortion correction applied by the configuration as a function of the pilot signals demodulated by the first and second demodulators.

The invention is applicable to all types of configurations, including feedforward, feedback, feedforward-feedback and pre-distortion. In the case of feedforward, the configuration may include first and second signal paths. The first signal path may have a delay element connected to a fixed-gain element, where the delay element is tapped at the input to the amplifier, and where the fixed-gain element is coupled to the output of the amplifier. The second signal path may have an attenuator connected to a phase shifter, where the attenuator is tapped at a point between the output of the amplifier and the point at which the output of the fixed-gain element is coupled to the output of the amplifier, and where the phase shifter is coupled to the first signal path at the output of the delay element.

When this type of feedforward configuration is employed, the controller could be located in the first signal path between the point at which the phase shifter is coupled to the first signal path and the input to the fixed-gain element. Also, the "first point" could be located at the output of the attenuator and the "second point" could be located at the output of a second attenuator tapped after the output of the fixed-gain element is coupled to the output of the first delay element. Other arrangements are possible, some of which involve the inclusion of delay elements tapped from the output of the amplifier or from the output of the attenuator.

Advantageously, by comparing and attempting to match the pilot component present after distortion cancellation to the pilot component present before distortion cancellation, there results improved linear performance of the amplifier configuration as a whole. This is partly due to the fact that the pilot component occupies the same frequency region as the information component. Because of the improved degree of linearization, it is possible to rate the configuration for higher nominal output power. It may even be possible to extend the operating bandwidth of the amplifier configuration.

Also, by cancelling distortion in a band of interest in the manner of the present invention, there will be no additional contamination of the power spectrum. Advantageously, therefore, the incidence of extraneous signals appearing in frequency regions outside or inside the band of interest will be reduced.

BRIEF DESCRIPTION OF THE DRAWINGS

These and other aspects and features of the present invention will now become apparent to those of ordinary skill in the art upon review of the accompanying description of specific embodiments of the invention in conjunction with the following drawings, in which.

DETAILED DESCRIPTION OF THE PREFERRED EMBODIMENTS

Figure 1A:
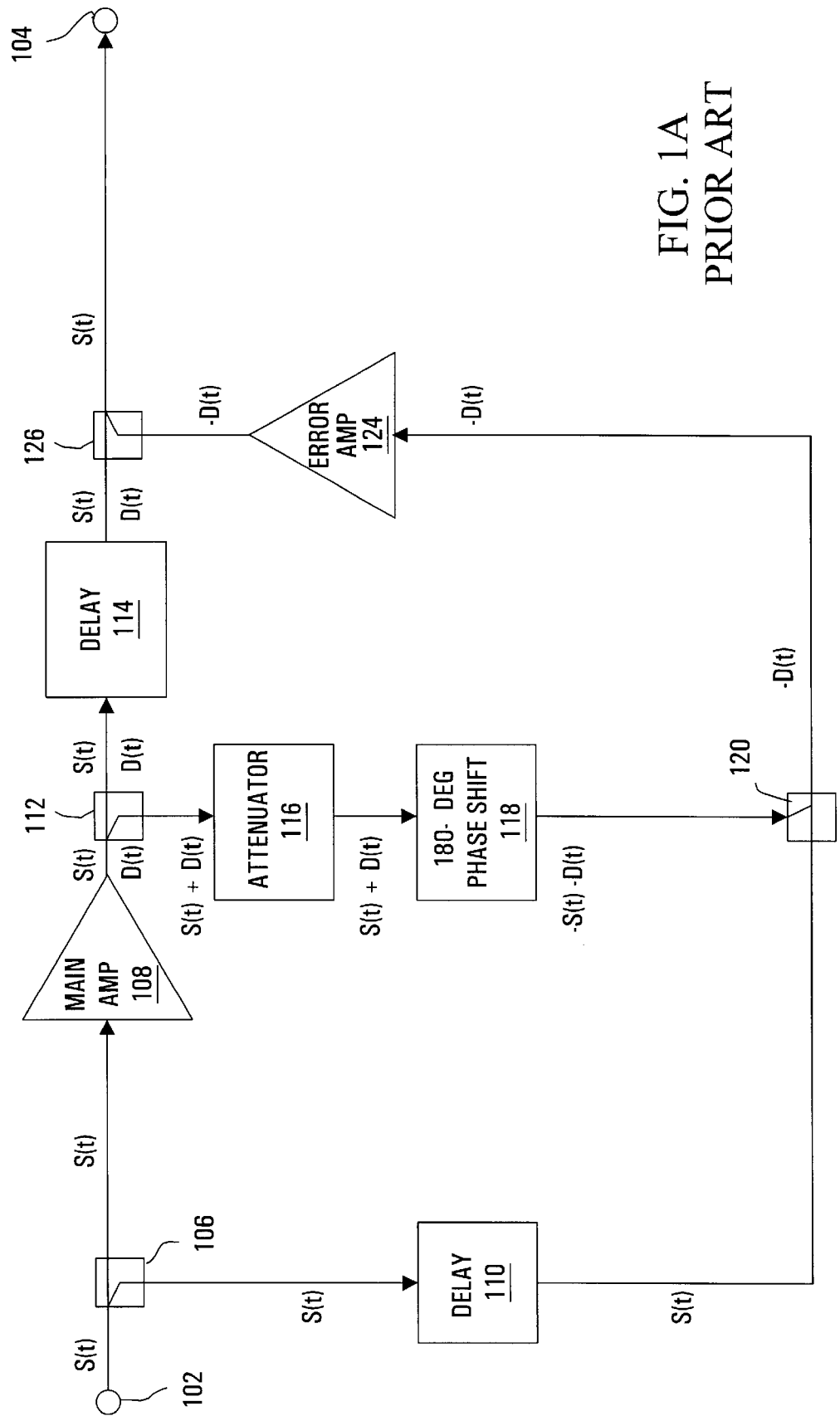
FIG. 1A is a block diagram of a conventional feedforward amplifier linearization circuit.

The structure, operation and advantages of the present invention will be most easily understood and appreciated following a more detailed description of a known amplifier configuration and its shortcomings. To this end, reference is first made to FIG. 1A, which shows a main amplifier 108 equipped with a standard feedforward linearization circuit. In a wireless environment, the conventional configuration of FIG. 1A could be located at the output of a base transceiver station, between an up-converter and an antenna. As such, the circuit of FIG. 1A has an input radio-frequency (RF) port 102 and an output RF port 104.

A main signal path is located between the input RF port 102 and the output RF port 104. The main signal path comprises a series connection of a splitter 106, a main amplifier 108, another splitter 112, a delay element 114 and a coupler 126.

The splitters 106, 112 and the coupler 126 can be implemented in any appropriate technology such as stripline. Example of suitable splitters 106, 112 and coupler 126 include Anaren Xinger model "4A1305", which is operable in the frequency range of 1.4 to 2.6 GHz, model "1A1305-20", which provides 20 dB of attenuation in the frequency range of 1.5 to 2.2 GHz, and model "1A1305-10", which provides 10 dB of attenuation in the frequency range of 1.5 to 2.2 GHz. The delay element 114 can be implemented in any suitable technology such as a coaxial line.

While one output of the splitter 106 continues along the main signal path, the other output of the splitter 106 heads along a feedforward path consisting of another delay element 110, a coupler 120 and an error amplifier 124. The output of the error amplifier 124 leads to the second input of the coupler 126 in the main signal path.

The coupler 120 is also a two-input one-output coupler. One of its inputs is connected to the output of the delay element 110, while another one of its inputs is fed from a 180-degree phase shifter 118. The phase shifter 118 is connected to the output of an attenuator 116, whose input is connected to another output of the splitter 112 in the main signal path. The attenuator 116 can be implemented in any suitable technology, for example, a resistive 50-ohm pi-network attenuator.

In operation, the input RF port 102 carries an incoming RF signal which needs to be amplified in a linear fashion. The incoming RF signal (hereinafter referred to as the "information signal") contains an information component S(t) destined for one or more recipients which, in the context of a wireless system, could be mobile units. The information signal arrives at the splitter 106, which divides the power of the information into two signals sent along separate paths, one of which leads to the main amplifier 108 along the main signal path and the other of which leads to the delay element 110 along the feedforward path.

Ideally, the main amplifier 108 produces an output signal that is an exact replica of its input signal but with a greater magnitude and uniform delay at all frequencies. However, the main amplifier 108 exhibits nonlinear behaviour and thus it produces a signal which has both a desired information component S(t) and an unwanted distortion component D(t).

Part of the output of the main amplifier 108 is then diverted along the correction path by the splitter 112. More specifically, the splitter 112 separates the output of the main amplifier 108 into two signals, one of which continues along the main signal path towards the delay element 114 and the other of which arrives at the attenuator 116 in the correction path.

The attenuator 116 is assumed to perform distortion-free attenuation of its input signal, thereby producing a signal that is fed to the 180-degree phase shifter 118. For its part, the 180-degree phase shifter 118 acts as an inverter and produces an output that is the negative of its input. Hence, the output of the phase shifter 118 has a phase-inverted information component −S(t) and a phase-inverted distortion component −D(t).

It is recalled that the output of the phase shifter 118 is fed to one input of the coupler 120 and that the second input of the coupler 120 arrives from the delay element 110. The purpose of the coupler 120 is to produce an output signal that is free of any trace of the information component S(t). This can be achieved if:

(a) The signals at the two inputs of the coupler 120 are in 180-degree offset with one another, which is achieved if the delay introduced by the delay element 110 matches the delay through the main amplifier 108, the attenuator 116 and the phase shifter 118; and (b) The levels at the two inputs of the coupler 120 are the same, which is achieved if the attenuation of the attenuator 116 takes into account the attenuation introduced by the splitters 106, 112, as well as the gain supplied by the main amplifier 108 and the construction of the coupler 120.

Assuming that cancellation of the information component has indeed occurred in the desired manner, the signal at the output of the coupler 120 contains only a phase-inverted distortion component (denoted −D(t)) and this signal is fed to the error amplifier 124.

The error amplifier 124 is assumed to apply distortion-free gain. Although it would appear that the requirement for distortion-free gain is a paradox in view of the inability of the main amplifier 108 to satisfy this very condition, it is remarked that the signal being amplified by the error amplifier 124 lacks an information component and therefore has significantly lower power. At lower power levels, amplifier distortion is not as severe and the error amplifier 124 can usually achieve a high degree of fidelity.

The error amplifier 124 thus produces an output which is fed to one input of the coupler 126. The other input of the coupler 126 is the output of the delay element 114. It is noted that the output of the delay element 114 has both an information component S(t) and a distortion component D(t), while the output of the error amplifier 124 has only a phase-inverted distortion component −D(t).

The purpose of the coupler 126 is to remove the distortion component from the signal at the output of the delay element 114, leaving only an information component at the output of the coupler 126. Hence, for best results, the gain of the error amplifier 124 should be adjusted so that it takes into account the losses of the splitter 112, the attenuator 116 and the coupler 120, while the delay introduced by the delay element 114 should be adjusted so that it accounts for the delay through the error amplifier 124, the attenuator 116 and the phase shifter 118.

Under ideal cancellation conditions, therefore, the output of the coupler 126 is free of any distortion component, leaving only an amplified and delayed information component S(t), as desired.

Although it is possible to manufacture the elements in the amplifier configuration of FIG. 1A such that the just described gain and delay requirements are met to a first approximation, the delay elements 110, 114 and the phase shifter 118 introduce non-negligible losses and the attenuator 116, the splitters 106, 112 and the couplers 120, 126 introduce non-negligible delays. Also, the gain and delay of each component in the circuit will vary with the part's age and temperature. Thus, although the amplifier 108 can be linearized under certain steady-state conditions using the configuration of FIG. 1A, the linearization may require considerable improvement for certain long-term high-fidelity applications.

To further improve linear operation of the amplifier circuit, the art has seen the development of an adaptive scheme, whereby a "pilot" signal is injected into, and later removed from, the information signal travelling along the main signal stream. With additional reference to FIG. 1B, there is shown a known pilot-assisted feedforward configuration based on the circuit of FIG. 1A.

The structural changes basically include the addition of a pilot generator 107 whose output is coupled to the main signal path by a two-input one-output coupler 109. Also, an amplitude controller 121 and a phase controller 123 have been inserted in the feedforward path at the input to the error amplifier 124. The amplitude controller 121 is typically a variable attenuator in an appropriate technology, e.g., by changing the bias of a PIN diode, an example of which is PIN diode attenuator model "PI-820" by KDI. The phase controller 123 is typically a voltage-controlled variable phase shifter, for example model "SQ-003" by KDI.

The amplitude controller 121 and the phase controller 123 are controlled by a gain and phase control circuit 122 at the end of a control path. The remainder of the control path consists of a series connection of an attenuator 130 and a pilot demodulator 128. The attenuator 130 receives its input from one output of a splitter 132 inserted in the main signal path leading to the output RF port 104.

In operation, a pilot signal having an out-of-band pilot component P(t) is generated by the pilot generator 107. As discussed previously, the pilot signal must lie outside the frequency range occupied by the information signal in order not to cause interference therewith. The pilot signal is inserted into the main signal path by the coupler 109 which is located at the entrance to the main amplifier 108.

The main amplifier 108 performs amplification of its input signal which contains an information component S(t) and a pilot component P(t). Because it operates nonlinearly, the main amplifier 108 produces an output having an information component S(t), a pilot component P(t) and a distortion component D(t). The output of the main amplifier 108 is sent along two directions by the splitter 112. Part of this amplified signal heads into the correction path and enters the attenuator 116, while the remainder of the amplified signal continues along the main signal path through the delay element 114.

Within the correction path, the signal having an information component S(t), a pilot component P(t) and a distortion component D(t) travels through the phase shifter 118, resulting in a signal with a phase-inverted information component −S(t), a phase-inverted pilot component −P(t) and a phase-inverted distortion component −D(t).

The output of the phase shifter 118 reaches the coupler 120, whose role it is to cancel the information component S(t) arriving from the delay element 110. Hence, the output of the coupler 120 will be a signal containing a phase-inverted pilot component −P(t) and a phase-inverted distortion component −D(t).

The output of the coupler 120 then enters the error amplifier 124 but before doing so, passes through the amplitude modulator 121 and the phase controller 123. The amplitude and phase controllers 121, 123 apply limited but controllable amplitude and phase variations to the signal output by the coupler 120. The error amplifier 124 applies distortion-free amplification of its input signal and thus the signal at the output of the error amplifier 124 will contain a phase-inverted distortion component −D(t) in addition to a phase-inverted pilot signal −P(t).

At the coupler 126, the pilot signal P(t) output by the delay element 114 meets the phase-inverted pilot signal −P(t) which has emerged from the error amplifier 124. Thus, the coupler 126 provides cancellation of the pilot in much the same way as it provides cancellation of the distortion because the pilot component P(t) and the distortion component D(t) have travelled together along exactly the same path through the correction path and the feedforward path.

Clearly, because the path travelled by the distortion component and the pilot signal is identical, any distortion remaining at the output of the coupler 126 is expected to be accompanied by a remnant of the pilot signal. Therefore, in an attempt to minimize the distortion introduced by the main amplifier 108, existing techniques concentrate on minimizing the power of the pilot component P(t) present at the output of the coupler 126.

Figure 1B:
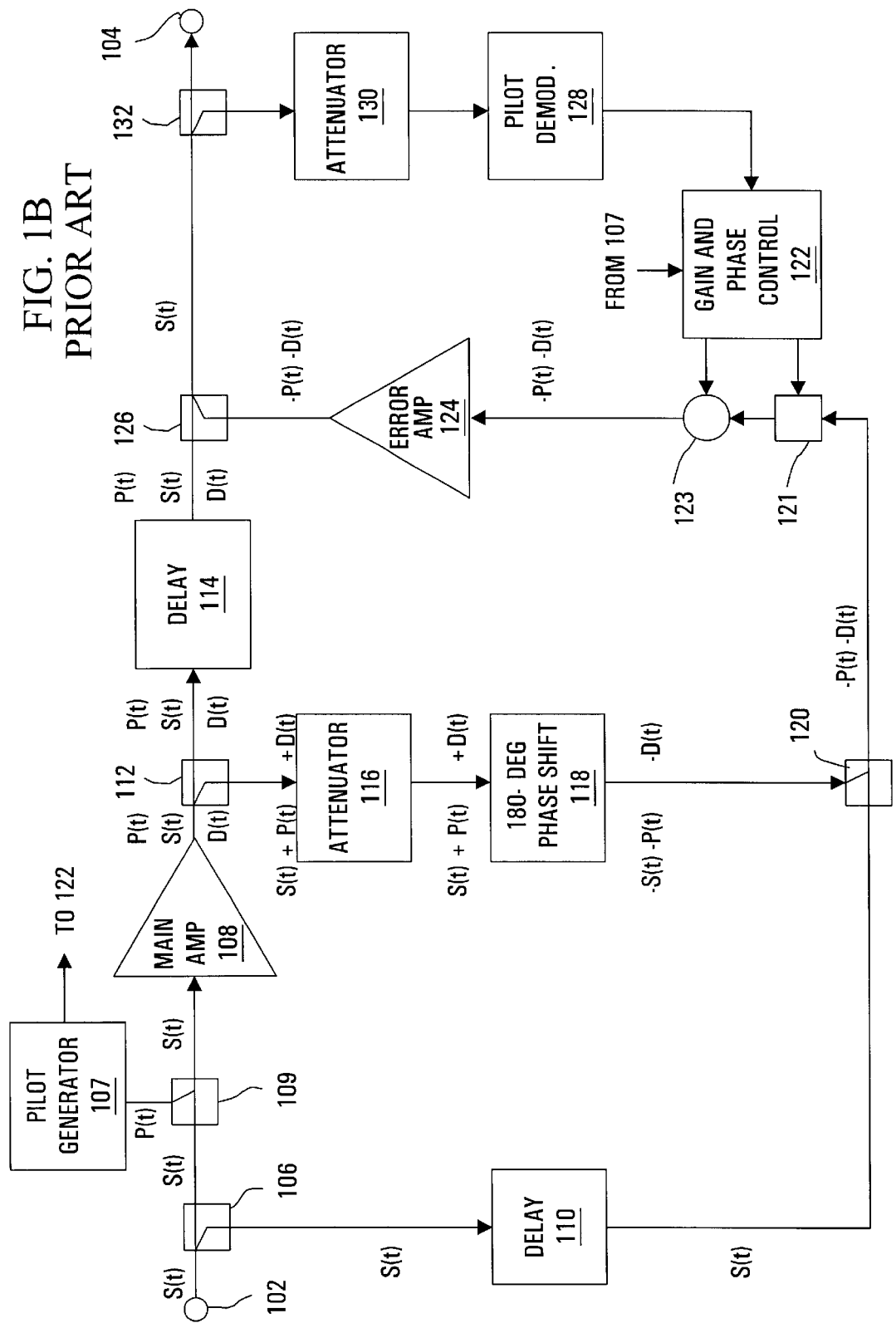
FIG. 1B is the circuit of FIG. 1A which uses injection and subsequent elimination of a pilot signal.

To this end, the configuration of FIG. 1B provides the control path at the output of the coupler 126, in which the output RF signal passes through the splitter 132, the attenuator 130, the pilot demodulator 128 and the gain and phase control circuit 122. The pilot demodulator 128 typically contains a filter for removing the frequencies occupied by the information signal, as well as circuitry for correlating the remaining signal with the known pilot signal and integrating the result.

The gain and phase control circuit 122 typically comprises a square-law detector and an integrator in order to estimate the power of the pilot component. The output of the gain and phase control circuit 122 is used to drive both the amplitude and phase controllers 121, 123.

Thus, it can be seen that the control path is used to vary the gain and phase of the signal at the input to the error amplifier 124 until the power of the pilot component demodulated by the pilot demodulator 128 is minimized. When the power of the pilot component has been minimized, it is inferred that distortion is also minimized and that improved linearization of the main amplifier 108 has been achieved.

In actuality, however, only a limited improvement in distortion correction can be achieved using the circuit of FIG. 1B because of several inherent problems with this scheme. For example, because the aim of the control path is to remove the pilot component by virtue of having minimized its power, it is impossible to allow the pilot signal to occupy the same frequency range as the incoming information signal without affecting its information component S(t). Conversely, if the pilot signal shares the same frequency band as the information signal, the information signal may interfere with the pilot signal and may therefore affect the accuracy with which the pilot component is detected by the pilot demodulator 128.

For these reasons, conventional pilot-assisted feedforward systems use an out-of-band pilot signal, i.e., the pilot signal does not share the same frequency region as the information signal. However, in this case, it is no longer recommended to rely on the power of the pilot component as an indicator of the amount of distortion introduced by the main amplifier 108. This is because the behaviour of the main amplifier 108 and the other parts of the circuit will tend to differ in the two frequency regions, resulting in insufficient distortion correction for certain applications.

Furthermore, in the case of a multi-channel amplifier where the band of interest changes with time, a complex control scheme will be required to ensure that the pilot signal is placed in proximity to the band of interest.

Moreover, if the out-of-band pilot signal cannot be removed to the required degree (e.g., to the specifications of a regulatory body such as the FCC) by way of coupling at the coupler 126, an additional filtering stage may be required between the splitter 132 and the RF output port 104. Such an additional filtering stage may be expensive and can introduce further non-linearities which may compound those already present due to the main amplifier 108.

The present invention overcomes these disadvantages by relying on a pilot signal which is embedded in the incoming information signal and which is intended to be transmitted across the air interface. In other words, the required pilot signal is "in-band" with the information signal and its presence at the output of the amplifier is desired. Currently, the most common wireless architecture employing a pilot signal meeting these criteria is CDMA (code division multiple access), although it is envisaged that the invention may find applicability in future versions of FDMA, TDMA, GSM, AMPS or any other system which provides for the use of an embedded pilot signal.

In a version of CDMA known as IS-95, the pilot signal is the result of spreading Walsh code 00 with a pseudo-random noise (PN) sequence of period of $2^{15}$ chips at a chip rate of 1.2288e+06 chips per second. However, since Walsh code 00 is a constant, the resulting pilot signal is thus the PN sequence itself. Of course, it is within the scope of the invention to use other types of pilot signals which may have square or sinusoidal shapes, for example.

By way of another example, the present invention can be applied to a multi-channel frequency-division multiplexed system in which there are N frequency channels, among which N−1 (or fewer) channels are user channels and 1 (or more) channel is a pilot channel. The pilot channel(s) may be located towards the center of the band of interest. Each pilot channel may contain a carrier-modulated tone.

In order to achieve improved amplifier linearization, the invention compares the pilot component of a signal at two or more points in the circuit, for example, before and after correction by the error amplifier. A more detailed description of the invention is now provided with reference to FIG. 2A, wherein is shown a feedforward linearization circuit according to a specific embodiment of the present invention. The main structural modifications of the circuit in FIG. 2A as compared with the circuit in FIG. 1B include the absence of the pilot generator (107 in FIG. 1B) and the presence of two control paths having respective pilot demodulators 202, 208 which produce respective demodulated pilot signals 204, 206.

A one-input, two-output splitter 212 is placed in the correction path at the output of the attenuator 116 and supplies the pilot demodulator 202 with an attenuated version of the output of the main amplifier 108. Desirably, a delay element 214 will be placed between the splitter 212 and the pilot demodulator 202. The delay introduced by the delay element 214 is desirably equal to the delay introduced by the delay element 114. The other pilot demodulator 208 receives its input signal from the output of the attenuator 130.

The pilot demodulators 202, 208 are similar to the pilot demodulator 128 of FIG. 1B in that they comprise circuitry for detecting the presence of a pilot component in a received signal. However, the pilot demodulators 202, 208 are substantially different from those of FIG. 1B because they comprise circuitry for searching for the presence of an embedded, in-band pilot signal instead of an out-of-band pilot signal. A suitable pilot demodulator can be of the chip type used in a mobile unit receiver, for example. Of course, it is within the scope of the invention to use hardware, software, control logic or any combination thereof which allows the pilot signal to be extracted.

The pilot demodulators 202, 208 are connected to a gain and phase control circuit 210. The gain and phase control circuit 210 is responsible for processing the two demodulated pilot signals 204, 206 and adjusting the amplitude and phase controllers 121, 123 in accordance with a function of the two demodulated pilot signals 204, 206. The processing may be effected in either the analog or digital domain and thus the gain and phase control circuit 210 may comprise circuitry, firmware, control logic or software, as appropriate, for providing the desired amount of processing.

For example, the gain and phase control circuit 210 may comprise circuitry for determining the amplitude difference and the phase difference between the two demodulated pilot signals 204, 206. For this purpose, the gain and phase control circuit 210 can include a pair of amplitude discriminators 302, 312, a pair of phase discriminators 304, 314, an amplitude comparator 322 and a phase comparator 324.

Inside the gain and phase control circuit 210, the pilot signals 204, 206 are respectively fed to the amplitude discriminators 302, 312 and to the phase discriminators 304, 314. The amplitude comparator 322 has one input connected to each of the amplitude discriminators 302, 312 and controls the amplitude controller 121, while the phase comparator 324 has one input connected to each of the phase discriminators 304, 314 and controls the phase controller 123.

Each of the amplitude discriminators 302, 312 could be a circuit which holds the maximum value of its input over approximately one or more periods of the pilot signal. Each of the phase discriminators 304, 314 could be a circuit which generates a signal having a voltage which is proportional to the phase of the respective demodulated pilot signal 204, 206. Each of the comparators 322, 324 could be an operational amplifier.

In operation, an information signal (which contains both an information component S(t) and an embedded pilot component E(t)) arrives at the input RF port 102 and is split into two directions by the splitter 106. The splitter 106 sends part of the information signal to the main amplifier 108 in the main signal path and part of the information signal to the delay element 110 in the feedforward path.

The main amplifier 108 operates in a nonlinear fashion and therefore the signal at its output contains a distortion component D(t) in addition to an information component S(t) and a pilot component E(t). The splitter 112 then sends the output of the main amplifier 108 partly to the delay element 114 in the main signal path and partly to the attenuator 116 in the correction path.

The output of the attenuator 116 passes through the 180-degree phase shifter 118 before reaching a second input of the coupler 120. Thus, one input of the coupler 120 will be fed by the attenuator 116 and will have a phase-inverted information component −S(t), a phase-inverted pilot component −E(t) and a phase-inverted distortion component −D(t). The other input of the coupler 120 will be fed by the delay element 110, and will have only an information component S(t) and a pilot component E(t).

The purpose of the coupler 120 in the feedforward path is to cancel both the information component S(t) and the pilot component E(t) and to provide only a phase-inverted distortion component −D(t) at its output. To ensure proper operation of the coupler 120, the delay provided by the delay element 110 should therefore match the delay through the main amplifier 108, the attenuator 116 and the phase shifter 118. Also, the loss provided by the attenuator 116 should take into consideration the gain of the main amplifier 108 as well as the losses of the splitters 106, 112 and the construction of the coupler 120.

The output of the coupler 120 which, in the ideal case, contains only a phase-inverted distortion component −D(t), then continues along the feedforward path and passes through the amplitude controller 121, the phase controller 123 and the error amplifier 124. It should be noted that either one of the two modulators 121, 123 is sufficient to achieve improved linearization but that better performance improvement is likely to be achieved by using both modulators 121, 123.

Next, the error amplifier 124 amplifies its input signal, which contains a phase-inverted distortion component −D(t). The error amplifier 124 causes only negligible distortion because its input signal does not contain an information component and remains within the error amplifier's linear region of operation.

The output of the error amplifier 124 is thus a signal containing a phase-inverted distortion component −D(t), which is fed to one input of the coupler 126. The other input of the coupler 126 arrives from the delay element 114 in the main signal path and contains an information component S(t), a pilot component E(t) and a distortion component D(t).

The purpose of the coupler 126 is to provide cancellation of the distortion component D(t) without cancelling the pilot component E(t). This will be achieved because the signal emerging from the error amplifier 124 contains only a phase-inverted distortion component −D(t) by virtue of the pilot component having already been removed from the feedforward path at the coupler 120.

In order to achieve a reasonable degree of distortion cancellation at the coupler 126, the gain provided by the error amplifier 124 should account for the losses of the splitter 112, the couplers 120, 126 and the attenuator 116, while the delay provided by the delay element 114 ideally matches the delay through the signal path made up of the attenuator 116, the phase shifter 118 and the error amplifier 124.

When perfect cancellation is achieved, the output of the coupler 126 headed for the output RF port 104 contains an information component S(t) and an embedded pilot component E(t), but contains no trace of a distortion component. However, it is usually not possible to select the parameters of the error amplifier 124 and the delay element 114 such that perfect cancellation is achieved at all temperatures and for components of any age.

According to the invention, the control paths provide a means of adaptively maintaining a high level of cancellation. Specifically, the pilot component E(t) is demodulated both before and after cancellation at the coupler 126. The delay element 214 introduces a delay which is desirably equal to that introduced by the delay element 114 in order to ensure that the signals 204, 206 being demodulated by the pilot demodulators 202, 208 have substantially the same phase under conditions of perfect cancellation.

The two demodulated pilot signals 204, 206 are compared at the gain and phase control circuit 210. Differences in the amplitude or phase of the two demodulated pilot signals 204, 206 are used to drive the amplitude and phase controllers 121, 123, thereby completing a feedback loop.

Thus, if it is found that the demodulated pilot signal 206 is of greater amplitude that the demodulated pilot signal 204, the amplitude comparator 322 will cause a reduction in the amplitude of the signal being fed to the error amplifier 124, which will result in a reduction in the amplitude of the signal at the output of the error amplifier 124. This, in turn, will reduce the amplitude of the signal exiting the coupler 126, including that of its pilot component E(t). Hence, the signal output by the pilot demodulator 208 will be reduced in amplitude, which means that the difference in amplitudes, as output by the amplitude comparator 322, will be closer to zero.

Similarly, if it is found that the demodulated pilot signal 206 is delayed with respect to the demodulated pilot signal 204, the output of the phase comparator 324 will advance the phase of the signal being fed to the error amplifier 124, which will result in an advance in the phase of the signal at the output of the error amplifier 124. This, in turn, will cause an advance in the phase of the signal exiting the coupler 126, including that of its pilot component E(t). Hence, the signal output by the pilot demodulator 208 will be advanced in phase, which means that the output of the phase comparator 324 will be closer to zero.

Advantageously, by attempting to match the pilot component present after distortion cancellation at the coupler 126 to the pilot component present before distortion cancellation, there results improved linear performance of the configuration as a whole. This is mainly because the pilot component shares the same frequency region with the information component.

Also, because of the improved degree of linearization, it is possible to rate the configuration for higher nominal output power. It may even be possible to extend the operating bandwidth of the amplifier configuration.

It should also be noted that by cancelling distortion in a band of interest in the manner of the present invention, there will be no additional contamination of the power spectrum. Advantageously, therefore, no extraneous signals will appear in frequency regions outside the band of interest.

Figure 2A:
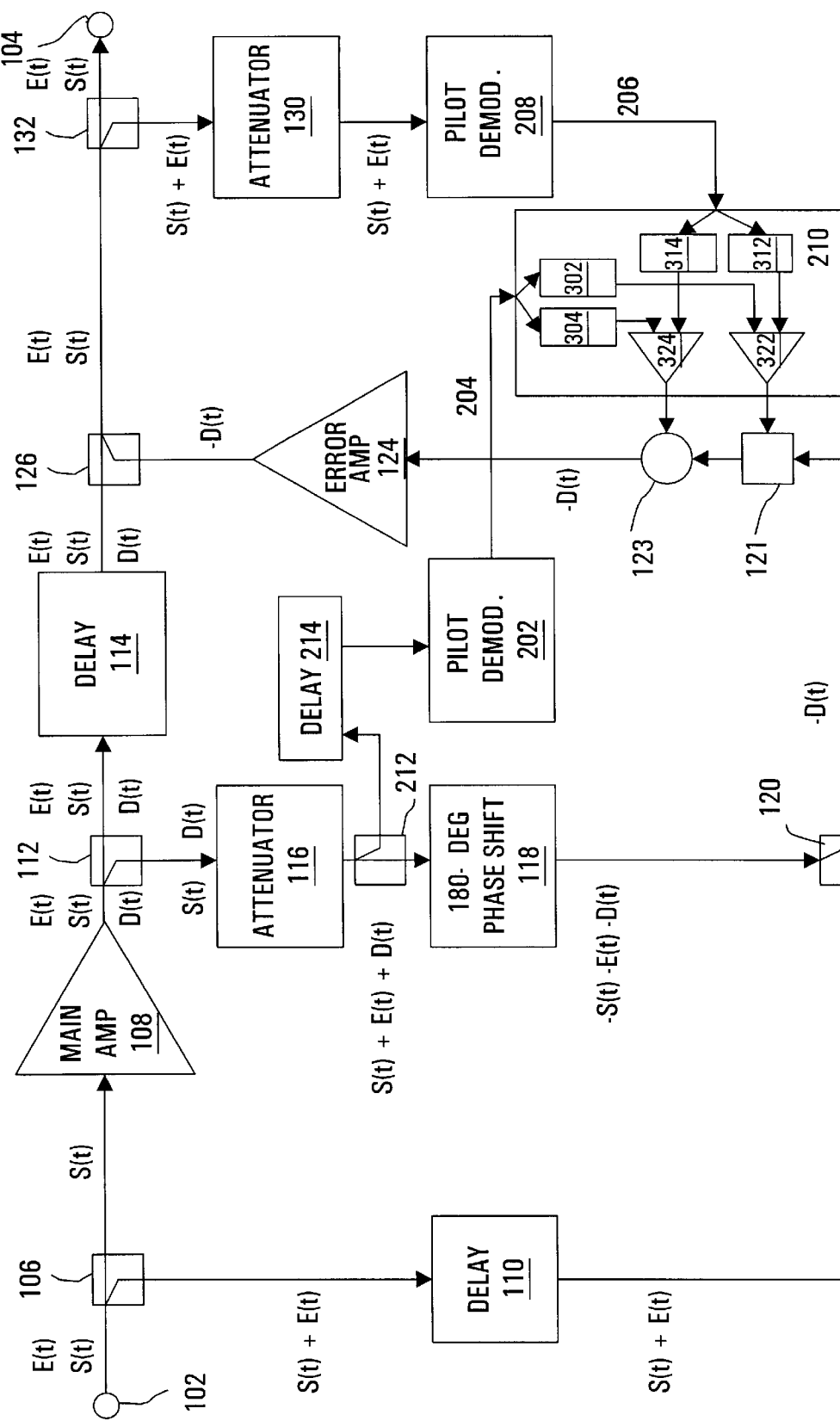
FIG. 2A is a block diagram of a feedforward amplifier linearization circuit which uses an embedded pilot signal, in accordance with a specific embodiment of the present invention.

In the specific embodiment of the gain and phase control circuit shown in FIG. 2A, the output of the amplitude comparator 322 is used for controlling the amount of gain applied by the amplitude controller 121 and the output of the phase comparator 324 is used for controlling the phase lead or lag applied by the phase controller 123. However, it should be understood that the amplitude comparator 322 could be used for controlling the phase controller 123 and the phase comparator 324 could be used for controlling the amplitude controller 121.

Also, it is within the scope of the invention to control the amplitude and phase controllers 121, 123 on the basis of a convergence indicator signal which could be a joint function of the two outputs provided by the amplitude and phase comparators 322, 324.

Figure 2B:
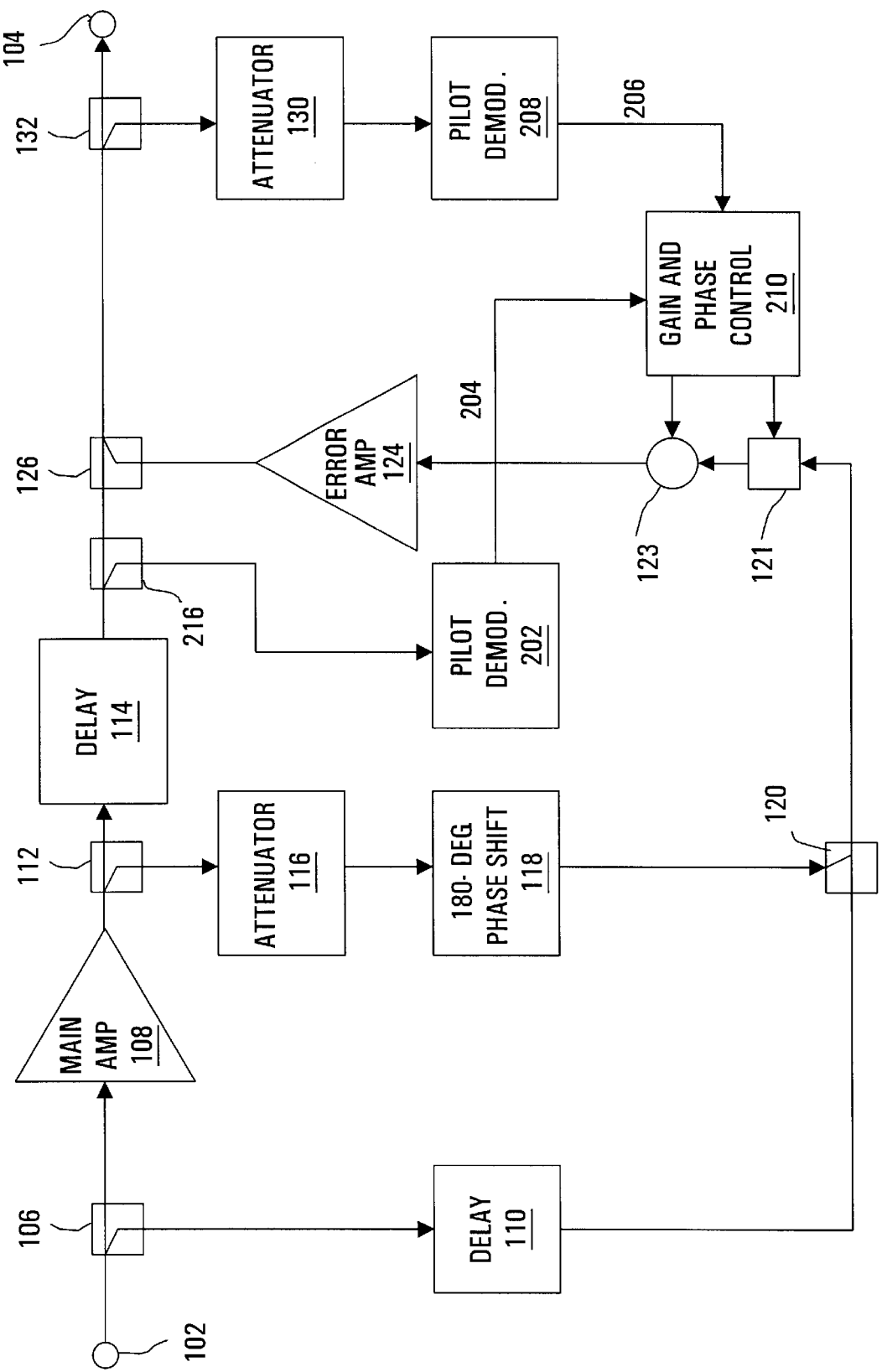
FIG. 2B is a variation of the circuit of FIG. 2A.

Also in the specific embodiment of the present invention shown in FIG. 2A, a delay element 214 is placed between the attenuator 116 and the pilot demodulator 202 in order to maintain a proper phase relationship between the two pilot signals 204, 206. It should be understood that alternative configurations exist, such as the one shown in FIG. 2B, in which a splitter 216 is placed at the output of the delay element 114 but still prior to the coupler 126.

Another alternative technique for maintaining the desired phase relationship involves providing a relative bias to the two inputs of the phase comparator 324 within the gain and phase control circuit 210. For example, if the phase difference introduced by the delay element 114 is 5 degrees and if the phase swing of the phase controller 123 is +90 degrees to −90 degrees for an input voltage range of +5 to −5 volts, then a bias of +278 mV applied to the output of the phase discriminator 314 would ensure that the two inputs to the phase comparator 324 are maintained at the appropriate phase difference. Alternatively, the output of the phase comparator 324 could be biased by +278 millivolts.

It should be appreciated, however, that although such phase compensation is desirable, the invention will still provide improved performance even in the absence of phase compensation.

Other alternatives of the invention include standard modifications to the feedforward configuration, such as performing the phase inversion one or more times at other points in the feedforward path and/or in the correction path.

Figure 3:
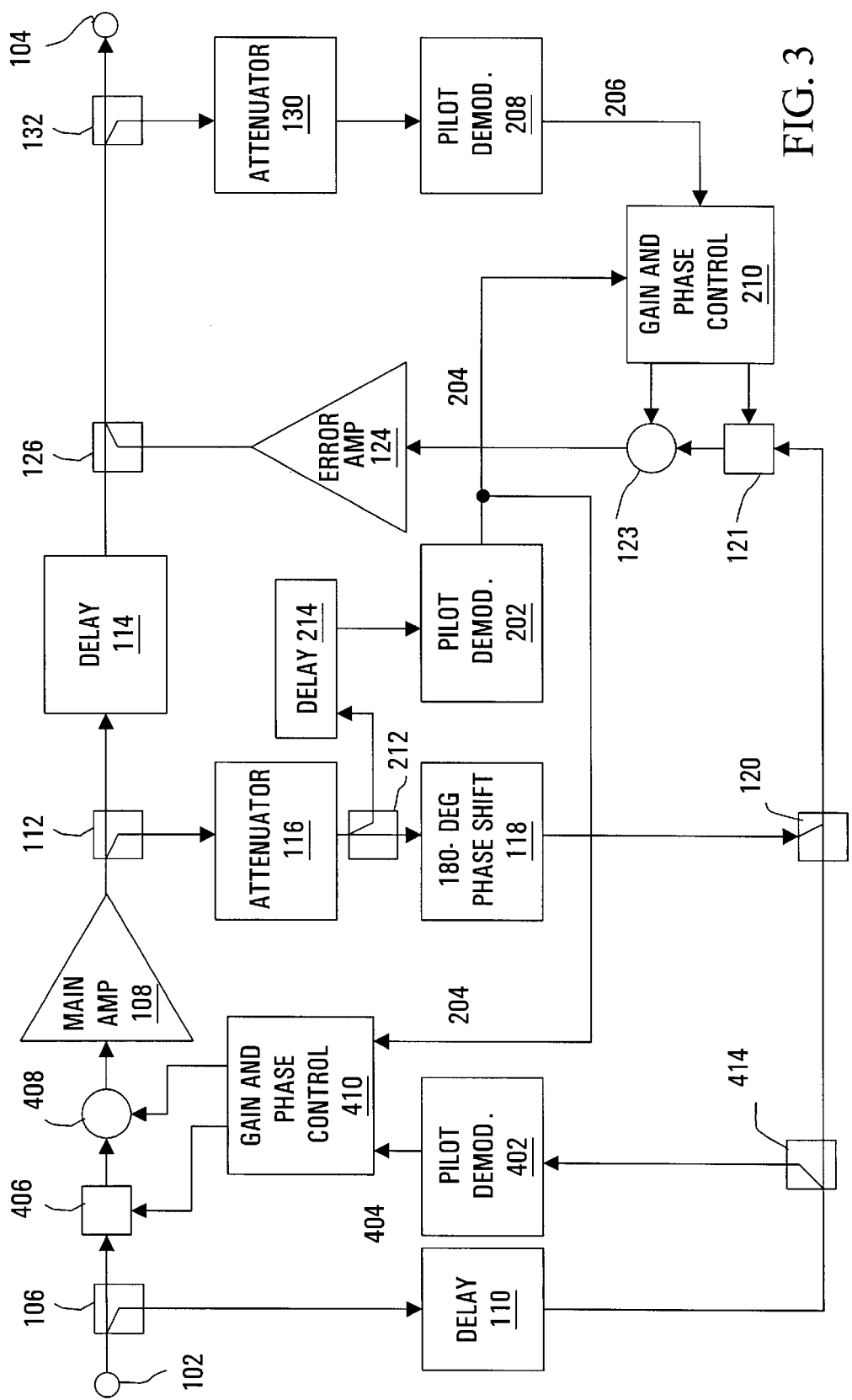
FIG. 3 shows the circuit of FIG. 2A which is further equipped with a feedback loop to control the gain and phase at the input to the main amplifier.

The configuration of FIG. 2A can provide further improved distortion cancellation by further extending the concept of the present invention to the feedforward-feedback scenario. For example, FIG. 3 shows the circuit of FIG. 2A, which has been supplemented by placing an amplitude controller 406 and a phase controller 408 in the main signal path immediately prior to the input of the main amplifier 108.

The amplitude and phase controllers 406, 408 are controlled by a gain and phase control circuit 410, which receives the demodulated pilot signal 204 from the pilot demodulator 202 and which receives another demodulated pilot signal 404 from a third pilot demodulator 402. The pilot demodulator 402 is identical to the pilot demodulators 202, 208 and is fed by one output of a splitter 414 connected at the end of the delay element 110 in the feedforward path. An attenuator (not shown) may be placed between the splitter 414 and the pilot demodulator 402. The gain and phase control circuit 410 is identical to the gain and phase control circuit 210.

Again, it is desirable to maintain a proper initial phase relationship between the demodulated pilot signals and this can be done, as illustrated, by providing a delay element 412 which introduces a delay that is ideally equal to the delay through the amplitude and phase controllers 406, 408, the main amplifier 108, the attenuator 116 and the delay element 214 minus the delay through the delay element 110.

In operation, the new feedback loop attempts to equalize the amplitude and/or phase demodulated pilot signals 204, 404. This is achieved by warping the incoming information signal such that the amount of distortion subsequently introduced by the main amplifier 108 cancels the warping effect, resulting in an output signal which is free of distortion when compared to the incoming information signal.

Again, improved performance will be achieved because (a) the pilot component is not removed from the main signal path, resulting in a cleaner estimate of the pilot component and reduced interference with the information component and (b) the pilot and information components share the same frequency range, resulting in a more reliable inference of linearity when convergence of the feedback loop is achieved.

It will also be appreciated that although the present invention has been described in the context of a feedforward amplifier configuration and a feedforward-feedback amplifier configuration, the invention is equally applicable to other configurations, such as pre-distortion and pure feedback.

In the above embodiments, the delay provided by the delay element 114 has been chosen to match the delay through the signal path made up of the attenuator 116, the phase shifter 118 and the error amplifier 124. In this most desirable of cases, the amount of correction is independent of the operating frequency. However, it is still possible to achieve correction using the configuration of the present invention in the case where the delay of the delay element 114 is shorter than the delay through the above-mentioned signal path. In this case, the amount of correction will generally be lower than in the ideal case and will be frequency-dependent. More specifically, the degree to which linearization is achieved will have local maxima and minima in the frequency spectrum and satisfactory cancellation is usually possible in a narrowband scenario by selecting the delay such that a local maximum appears in the band of interest. In fact, it is possible even to remove the delay element 114 altogether, in which case correction will only be provided at discrete carrier frequencies where the delay through the above-mentioned signal path is a multiple of the carrier frequency wavelength.

While specific embodiments of the present invention has been described and illustrated, it will be apparent to those skilled in the art that numerous modifications and variations can be made without departing from the scope of the invention as defined in the appended claims.

I claim:

1. A circuit for processing an information signal feeding an amplifier, in which is embedded a pilot signal, the amplifier having an input and an output, the circuit comprising:
    a feedforward configuration for applying distortion correction to the output of the amplifier, said configuration comprising: a first signal path being tapped at the input of the amplifier and connected to the output of the amplifier to apply said distortion correction; and a second signal path being tapped at a point between the output of the amplifier and the point at which the output of said first signal path is coupled to the output of the amplifier, said second signal path being coupled to the first signal path;
    a first demodulator, for demodulating the embedded pilot signal at a first point before distortion correction is applied by said configuration, to provide a first demodulated pilot signal;
    a second demodulator, for demodulating the embedded pilot signal at a second point after distortion correction is applied by said configuration, to provide a second demodulated pilot signal; and
    a controller connected to the first and second demodulators and connectable to said configuration, for varying the distortion correction applied by said configuration as a function of at least one parameter of the first and second demodulated pilot signals.

2. A circuit as claimed in claim 1, wherein:
    said first signal path comprises a delay element connected to a fixed-gain element, said delay element being tapped at the input to the amplifier, said fixed-gain element being coupled to the output of the amplifier;
    said second signal path comprises an attenuator connected to a phase shifter, said attenuator being tapped at a point between the output of the amplifier and the point at which the output of the fixed-gain element is coupled to the output of the amplifier, said phase shifter being coupled to the first signal path at the output of the delay element; and
    said controller is located in the first signal path between the point at which the phase shifter is coupled to the first signal path and the input to the fixed-gain element.

3. A circuit as claimed in claim 1, wherein:
    said first signal path comprises a delay element connected to a fixed-gain element, said delay element being tapped at the input to the amplifier, said fixed-gain element being coupled to the output of the amplifier;
    said second signal path comprises an attenuator connected to a phase shifter, said attenuator being tapped at a point between the output of the amplifier and the point at which the output of the fixed-gain element is coupled to the output of the amplifier, said phase shifter being coupled to the first signal path at the outcoat of the delay element; and
    said controller is partly located in the first signal path between the point at which the phase shifter is coupled to the fist signal path and the input to the fixed-gain element, and wherein said controller is also partly located at the input to the amplifier.

4. A circuit as claimed in claim 2, wherein said first point is located at the output of the attenuator.

5. A circuit as claimed in claim 4, wherein said controller is adapted to vary the amplitude or phase of the input to the fixed-gain element as a result of said function.

6. A circuit as claimed in claim 5, wherein said at least one parameter includes magnitude and wherein said function is the difference.

7. A circuit as claimed in claim 5, wherein said at least one parameter includes phase and wherein said function is the difference.

8. A circuit as claimed in claim 6, wherein said controller comprises:
    a first amplitude discriminator connected to the output of the first pilot demodulator, for generating a voltage proportional to the amplitude of the output of the first pilot demodulator;
    a second amplitude discriminator connected to the output of the second pilot demodulator, for generating a voltage proportional to the amplitude of the output of the second pilot demodulator; and
    a comparator connected to the first and second amplitude discriminators, for generating an output proportional to the difference between the voltages supplied by the first and second amplitude discriminators.

9. A circuit as claimed in claim 7, wherein said controller comprises:
    a first phase discriminator connected to the output of the first pilot demodulator, for generating a voltage proportional to the phase of the output of the first pilot demodulator;
    a second phase discriminator connected to the output of the second pilot demodulator, for generating a voltage proportional to the phase of the output of the second pilot demodulator; and
    a comparator connected to the first and second phase discriminators, for generating an output proportional to the difference between the voltages supplied by the first and second phase discriminators.

10. A circuit as claimed in claim 9, further comprising a voltage source for applying a relative voltage offset to the outputs of the first and second pilot demodulators.

11. A circuit as claimed in claim 9, further comprising a voltage source for applying a voltage bias to the output of the comparator.

12. A circuit as claimed in claim 2, the circuit further comprising a second delay element tapped at the output of the attenuator, wherein said first point is located at the output of the second delay element.

13. A circuit as claimed in claim 2, wherein said configuration comprises a second delay element connected between the point at which the output of the amplifier is tapped by the second signal path and the point at which the output of the amplifier is coupled to the first signal path, wherein said first point is located at the output of the second delay element before coupling of the output of the fixed-gain element.

14. A circuit as claimed in claim 2, further comprising a second attenuator tapped after coupling of the output of the fixed-gain element to the output of the amplifier, wherein said second point is located at the output of the second attenuator.

15. A circuit as claimed in claim 4, further comprising a second attenuator tapped after coupling of the output of the fixed-gain element to the output of the amplifier, wherein said second point is located at the output of the second attenuator.

16. A circuit as claimed in claim 12, further comprising a second attenuator tapped after coupling of the output of the fixed-gain element to the output of the amplifier, wherein said second point is located at the output of the second attenuator.

17. A circuit as claimed in claim 13, further comprising a second attenuator tapped after coupling of the output of the fixed-gain element to the output of the amplifier, wherein said second point is located at the output of the second attenuator.

18. A circuit as claimed in claim 12, wherein said configuration comprises a third delay element connected between the point at which the output of the amplifier is tapped by the second signal path and the point at which the output of the amplifier is coupled to the first signal path, wherein the delay introduced by the second delay element is substantially proportional to the delay introduced by the third delay element.

19. A circuit as claimed in claim 1, wherein said information signal is a multi-channel CDMA signal having at least one user code channel and at least one pilot code channel, wherein the pilot signal is contained in the at least one pilot code channel.

20. A circuit as claimed in claim 1, wherein said information signal is a multi-channel frequency division multiplexed signal having at least one information frequency channel and at least one pilot frequency channel, wherein the pilot signal is contained in the at least one pilot frequency channel.

21. A circuit for processing an information signal in which is embedded a pilot signal, said circuit being connectable to a feedback configuration used for applying distortion correction to the input of an amplifier fed by the information signal, the circuit comprising:

a first demodulator, for demodulating the embedded pilot signal at a point before distortion correction is applied by said configuration, to provide a first demodulated pilot signal;

a second demodulator, for demodulating the embedded pilot signal at a second point after distortion correction is applied by said configuration, to provide a second demodulated pilot signal; and a controller connected to the first and second demodulators and connectable to said configuration, for varying the amount of distortion correction applied by said configuration as a function of at least one parameter of the first and second demodulated pilot signals.

22. A circuit as claimed in claim 21, wherein said second point is located at the output of the amplifier.

23. A circuit for linearizing the response of an amplifier arranged to be fed at an input by an information signal in which is embedded a pilot signal, the circuit comprising:

a feedforward configuration for applying distortion correction to an output of the amplifier, the configuration comprising: a first signal path having a delay element connected to a fixed-gain element, said delay element being tapped at the input to the amplifier, said fixed-gain element being coupled to the output of the amplifier; and a second signal path having an attenuator connected to a phase shifter, said attenuator being tapped at a point between the output of the amplifier and the point at which the output of the fixed-gain element is coupled to the output of the amplifier, said phase shifter being coupled to the first signal path at the output of the delay element; and a first demodulator, for demodulating the embedded pilot signal at a first point before distortion correction is applied by said configuration, to provide a first demodulated pilot signal;

a second demodulator, for demodulating the embedded pilot signal at a second point after distortion correction is applied by said configuration, to provide a second demodulated pilot signal; and a controller connected to the first and second demodulators and connectable to said configuration, for varying the distortion correction applied by said configuration as a function of at least one parameter of the first and second demodulated pilot signals.

24. A circuit as claimed in claim 23, wherein said first point is located at the output of the attenuator.

25. A circuit as claimed in claim 24, wherein said controller is adapted to vary the amplitude or phase of the input to the fixed-gain element as a result of said function.

26. A circuit as claimed in claim 23, wherein said configuration comprises a second delay element connected between the point at which the output of the amplifier is tapped by the second signal path and the point at which the output of the amplifier is coupled to the first signal path.

27. A circuit as claimed in claim 26, wherein said first point is located at the output of the second delay element before being coupled to the output of the fixed-gain element.

28. A circuit as claimed in claim 26, the circuit further comprising a third delay element tapped at the output of the attenuator, wherein said first point is located at the output of the third delay element and wherein the delay introduced by the third delay element is substantially proportional to the delay introduced by the second delay element.

29. A circuit as claimed in claim 23, further comprising a second attenuator tapped after coupling of the output of the fixed-gain element to the output of the amplifier, wherein said second point is located at the output of the second attenuator.

30. A circuit as claimed in claim 24, further comprising a second attenuator tapped after coupling of the output of the fixed-gain element to the output of the amplifier, wherein said second point is located at the output of the second attenuator.

31. A circuit as claimed in claim 27, further comprising a second attenuator tapped after coupling of the output of the fixed-gain element to the output of the amplifier, wherein said second point is located at the output of the second attenuator.

32. A circuit as claimed in claim 28, further comprising a second attenuator tapped after coupling of the output of the fixed-gain element to the output of the amplifier, wherein said second point is located at the output of the second attenuator.

33. A circuit for linearizing the response of an amplifier arranged to be fed at an input by an information signal in which is embedded a pilot signal, the circuit comprising:
  a controller for applying distortion correction to the information signal prior to entering the input of the amplifier;
  a first demodulator having an output connected to the controller, for demodulating the embedded pilot signal at a first point before distortion correction is applied by said configuration, to provide a first demodulated pilot signal; and
  a second demodulator having an output connected to the controller, for demodulating the embedded pilot signal at a second point after distortion correction is applied by said configuration, to provide a second demodulated pilot signal;
    wherein the controller is arranged to process the first and second demodulated pilot signals and to vary the applied distortion correction as a function of at least one parameter of the first and second demodulated pilot signals.

34. A method of processing an information signal in which is embedded a pilot signal, comprising:
  passing the information signal through an amplifier having an input and an output;
  applying distortion correction at the input or output of the amplifier, said distortion correction being determined by combining a first signal tapped at the input of the amplifier with a second signal tapped at the output of the amplifier;
  demodulating the embedded pilot signal before applying distortion correction, to provide a first demodulated pilot signal;
  demodulating the embedded pilot signal after applying distortion correction, to provide a second demodulated pilot signal; and
  varying the amount of distortion correction as a function of at least one parameter of the first and second demodulated pilot signals.

35. A circuit for processing an information signal for feeding an amplifier, in which is embedded a pilot signal, the amplifier having an input and an output, the circuit comprising:
  a feedforward configuration for applying distortion correction to an output of the amplifier, said configuration comprising: a first signal path being tapped at the input of the amplifier and connected to the output of the amplifier to apply said distortion correction; and a second signal path being tapped at a point between the output of the amplifier and the point at which the output of said first signal path is coupled to the output of the amplifier, said second signal path being coupled to the first signal path;
  first demodulating means, for demodulating the embedded pilot signal at a first point before distortion correction is applied by said configuration, to provide a first demodulated pilot signal;
  second demodulating means, for demodulating the embedded pilot signal at a second point after distortion correction is applied by said configuration, to provide a second demodulated pilot signal; and
  varying means, connected to the first and second demodulating means and connectable to said configuration, for varying the distortion correction applied by said configuration as a function of at least one parameter of the first and second demodulated pilot signals.

36. A circuit as claimed in claim 35, wherein:
  said first signal path comprises a delay element connected to a fixed-gain element, said delay element being tapped at the input to the amplifiers said fixed-gain element being coupled to the output of the amplifier;
  said second signal path comprises an attenuator connected to a phase shifter, said attenuator being tapped at a point between the output of the amplifier and the point at which the output of the fixed-gain element is coupled to the output of the amplifier, said phase shifter being coupled to the first signal path at the output of the delay element; and
  said varying means is located in the first signal path between the point at which the phase shifter is coupled to the first signal path and the input to the fixed-gain element.

37. A circuit as claimed in claim 36, wherein said varying means comprises means for varying the amplitude or phase of the input to the fixed-gain element as a result of said function.

38. A circuit as claimed in claim 37, wherein said at least one parameter includes magnitude and wherein said function is the difference.

39. A circuit as claimed in claim 37, wherein said at least one parameter includes phase and wherein said function is the difference.

40. A circuit as claimed in claim 37, wherein said varying means comprises:
  first discrimination means, connected to the output of the first demodulating means, for generating a voltage proportional to the amplitude or phase of the output of the first demodulating means;
  second discrimination means, connected to the output of the second demodulating means, for generating a voltage proportional to the amplitude or phase of the output of the second demodulating means; and
  comparison means, connected to the first and second discrimination means, for generating an output proportional to the difference between the voltages supplied by the first and second discrimination means.

41. A circuit as claimed in claim 40, further comprising biasing means for applying a relative voltage offset to the outputs of the first and second demodulating means.

42. A circuit as claimed in claim 40, further comprising biasing means for applying a voltage bias to the output of the comparison means.

* * * * *